US006278750B1

(12) United States Patent
Yu (10) Patent No.: US 6,278,750 B1
(45) Date of Patent: Aug. 21, 2001

(54) FULLY INTEGRATED ARCHITECTURE FOR IMPROVED SIGMA-DELTA MODULATOR WITH AUTOMATIC GAIN CONTROLLER

(75) Inventor: Chu-Chiao Yu, Taipei (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 08/920,313

(22) Filed: Aug. 30, 1997

(51) Int. Cl.$^7$ .............................. H03M 3/02; H04L 27/08
(52) U.S. Cl. ......................... 375/345; 375/346; 341/143; 341/172
(58) Field of Search ..................................... 375/345, 355; 330/330, 279, 284, 278, 129; 455/234.1; 341/143, 172

(56) References Cited

U.S. PATENT DOCUMENTS

| 5,084,702 | * | 1/1992 | Ribner | 341/143 |
| 5,103,229 | * | 4/1992 | Ribner | 341/143 |
| 6,087,969 | * | 7/2000 | Stockstad et al. | 341/143 |

* cited by examiner

*Primary Examiner*—William Luther
(74) *Attorney, Agent, or Firm*—Bo-In Lin (57) ABSTRACT

The present invention discloses an automatic gain control (AGC) feedback-referenced sigma-delta modulating device provided for processing an analog signal received therein. This device includes an automatic gain controller (AGC) for receiving processing the analog input signal for generating an AGC feedback including a set of positive and negative AGC reference voltages. This device further include a sigma-delta modulator for receiving the analog input signal and the AGC feedback of the set of the positive and negative AGC reference voltages for generating a one binary bit output therefrom. In a preferred embodiment, the automatic gain controller (AGC) includes a peak detector for receiving and detecting a peak input voltage of the analog input signal. The automatic gain controller (AGC) further includes a maximum gain control block for receiving the peak input voltage from the peak value detector for generating a maximum gain controlled peak value Vp. And, the automatic gain controller (AGC) further includes a positive-and-negative AGC reference voltage (Vref$^+$_AGC, Vref$^-$_AGC) generation block for receiving and applying the maximum gain controlled peak value Vp to generate a positive AGC reference voltage Vref$^+$_AGC and a negative AGC reference voltage Vref−_AGC.

22 Claims, 10 Drawing Sheets

Switched Capacitor Implementation of Sigma - Delta Modulator

FIG. 8

Clock Diagram for Second-Order Sigma-Delta Modulator

FULLY INTEGRATED ARCHITECTURE FOR IMPROVED SIGMA-DELTA MODULATOR WITH AUTOMATIC GAIN CONTROLLER

BACKGROUND OF THE INVENTION

1. Field of the Invention

This invention relates generally to the circuit design of a ($\Sigma$-$\Delta$) modulator and an automatic gain controller (AGC) implemented as integrated circuits(ICs) on a semiconductor chip. More particularly, this invention relates to an improved circuit design and architecture to more completely integrate a ($\Sigma$-$\Delta$) modulator with an automatic gain controller (AGC) circuit such that areas occupied by the circuits on a semiconductor chip are reduced and better signal to noise ratio are achieved when less signal distortions are generated by implementing the improved circuit design disclosed by this invention.

2. Description of the Prior Art

A circuit designer is faced with the difficulties that wastes of wafer areas on a semiconductor chip and a great deal of signal distortions are often resulted from applying a conventional circuit design architecture for implementing an automatic gain controller (AGC) and a sigma-delta modulator in an integrated circuit (IC) chip. Specifically, the automatic gain controller and the sigma-delta modulator are designed separately as two independent circuit elements. A multiplexer is then employed for interconnecting these two independent separate circuit elements for processing an output signals from the automatic gain controller (AGC) to generate an input signal to the sigma-delta modulator.

Figure 1:
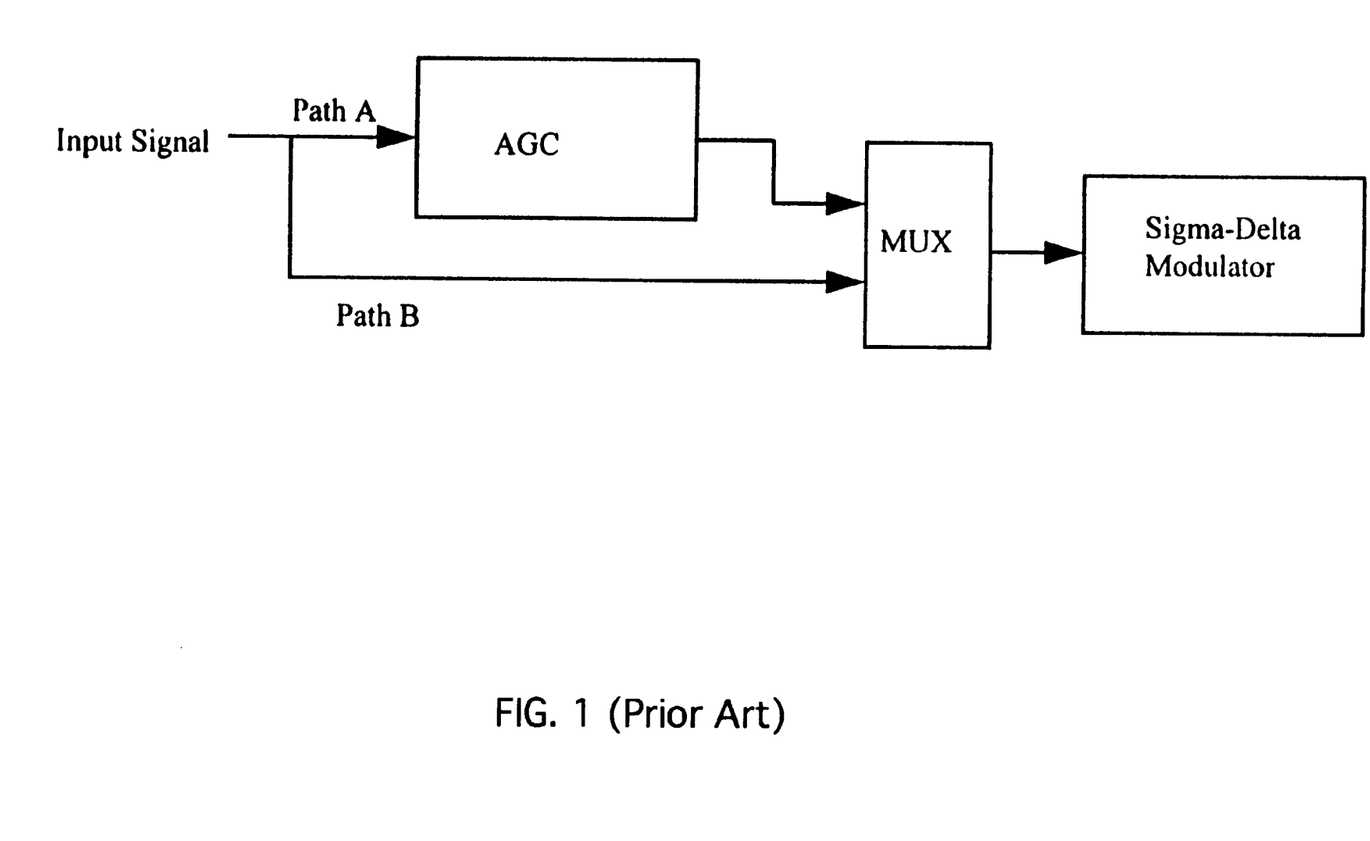
FIG. 1 is a circuit diagrams showing the conventional circuit configuration of the AGC and sigma-delta modulator implemented as two independent separate circuit elements.

FIGS. 1 shows a functional block diagram of a conventional circuit implementation of an automatic gain controller (AGC) and a sigma-delta ($\Sigma$-$\Delta$) modulator. This conventional circuit implementation employs a dual-path architecture where the input signal is transmitted via a first path, i.e., path-A, to be first processed by a gain controller (AGC). The input signal is also transmitted via a second path, i.e., path-B, as a direct input signal. An output generated by the gain controller AGC and the direct input signal via the second path path-B are inputted to a multiplexer (MUX) and a signal is selected between two signals as an input to a sigma-delta ($\Sigma$-$\Delta$) modulator to complete the analog to digital conversion. As will be further explained below there are several difficulties and limitations imposed by this dual path configuration.

Figure 2:
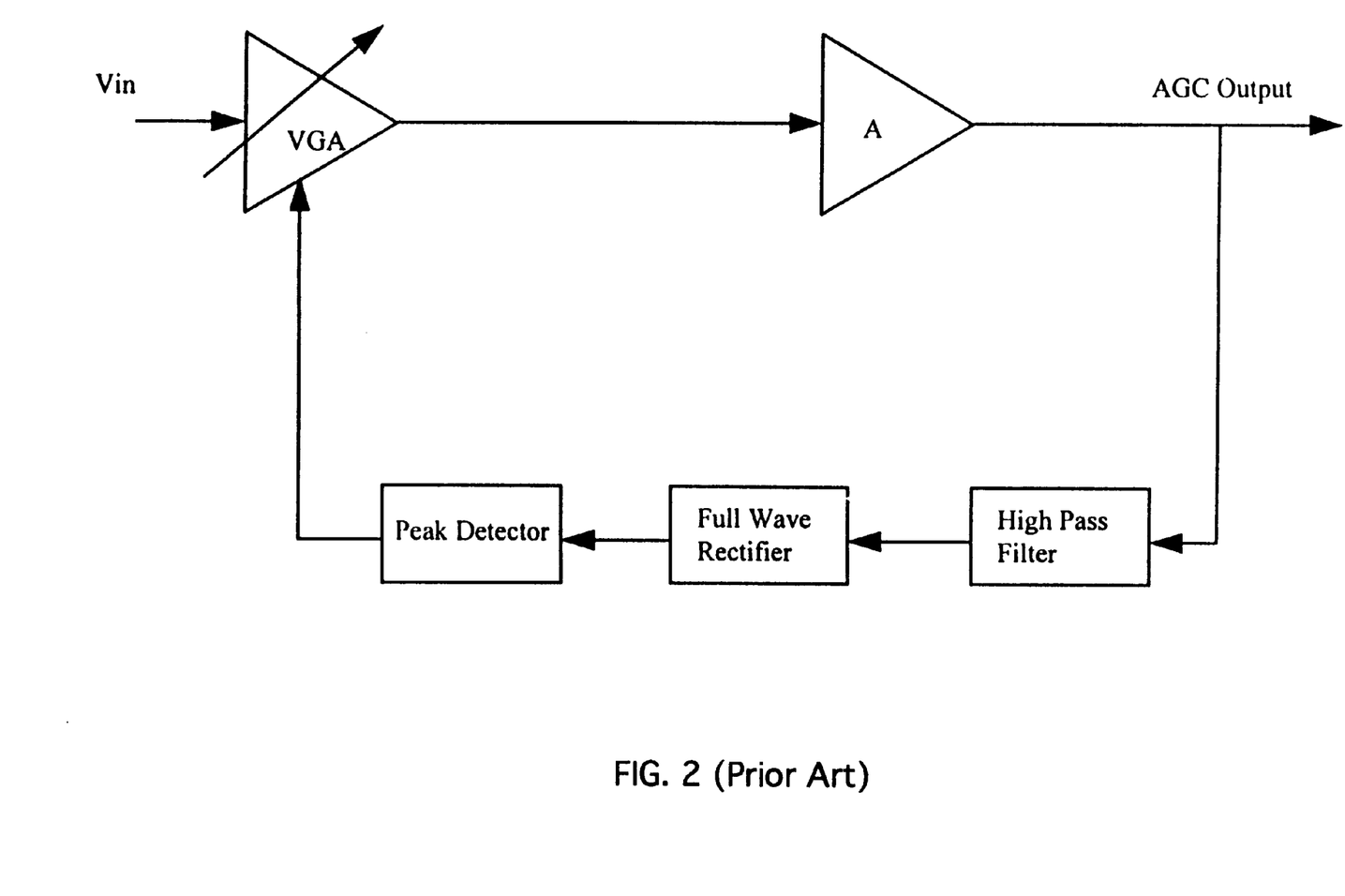
FIG. 2 is a functional block diagram of a conventional AGC device.

FIG. 2 shows a functional block of the automatic gain controller AGC of FIG. 1. The input signal to the AGC is first processed by a variable gain amplifier (VGA) and the output therefrom is then further processed by a gain amplifier A to generate an AGC output signal. The output signal is further inputted to a feedback loop which includes a high pass filter, a full wave rectifier and a peak detector to produce a feedback signal for inputting to the variable gain amplifier VGA to adjust the value of the gain such that the output of VGA is adjusted to have a fixed peak value. One definite disadvantage of this type of signal processing scheme is the reduction of the signal to noise ratio (SNR) when the amplitude of the input signal is increased. The reasons that the SNR is reduced with the increase of input signal will be further explained below when a comparison is made with the variations of the SNRs produced by a signal processing circuit of this invention.

Therefore, a need still exists in the art of circuit design and integrated circuit manufacture to provide a novel circuit design architecture to resolve the above difficulties. It is desirable that the circuit configuration can be conveniently implemented on a semiconductor chip as integrated circuited occupying less chip areas. It is further desirable that improved sigma-delta modulator can achieve better signal to noise ratios such that signal distortions produced can be significantly reduced.

SUMMARY OF THE PRESENT INVENTION

It is therefore an object of the present invention to provide a novel and improved circuit configuration and architecture for more fully integrating the AGC and the sigma-delta modulator to reduce the area requirements on a semiconductor chip and to improve the signal to noise ratio such that the aforementioned difficulties and limitations encountered in the prior art can be overcome.

Specifically, it is an object of the present invention to provide a novel and improved circuit design architecture and configuration of circuit implementation to perform more fully integrated AGC and sigma-delta modulation functions such that the areas occupied by these circuits on a semiconductor chip can be reduced.

Another object of the present invention is to provide a novel and improved circuit design architecture and configuration of circuit implementation to perform more fully integrated AGC and sigma-delta modulation functions such that the signal to noise ratios are improved with less signal distortions generated from the improved signal processing device.

Another object of the present invention is to provide a novel and improved circuit design architecture and configuration of circuit implementation to perform more fully integrated AGC and sigma-delta modulation functions such that better AGC performance is obtained by achieving improved of input/output transfer function.

Briefly, in a preferred embodiment, the present invention discloses an automatic gain control (AGC) feedback-referenced sigma-delta modulating device provided for processing an analog signal received therein. This device includes an automatic gain controller (AGC) for receiving processing the analog input signal for generating an AGC feedback including a set of positive and negative AGC reference voltages. This device further include a sigma-delta modulator for receiving the analog input signal and the AGC feedback of the set of the positive and negative AGC reference voltages for generating a one binary bit output therefrom. In a preferred embodiment, the automatic gain controller (AGC) includes a peak detector for receiving and detecting a peak input voltage of the analog input signal. The automatic gain controller (AGC) further includes a maximum gain control block for receiving the peak input voltage from the peak value detector for generating a maximum gain controlled peak value Vp. And, the automatic gain controller (AGC) further includes a positive-and-negative AGC reference voltage (Vref$^+$__AGC, Vref$^-$__AGC) generation block for receiving and applying the maximum gain controlled peak value Vp to generate a positive AGC reference voltage Vref+__AGC and a negative AGC reference voltage Vref$^-$__AGC.

The present invention further discloses a method for generating an automatic gain control (AGC) feedback-referenced sigma-delta modulating signal from an analog input signal. The method includes the step of a) an automatic gain controller (AGC) for receiving processing the analog input signal for generating an AGC feedback including a set of positive and negative AGC reference voltages; and b) applying a sigma-delta modulator for receiving the analog input signal and the AGC feedback of the set of the positive and negative AGC reference voltages for generating a one binary bit output therefrom. In a preferred embodiment, the step a) of applying the automatic gain controller (AGC) for generating an AGC feedback further includes a step a1) of applying a peak detector for receiving and detecting a peak input voltage of the analog input signal; a2) applying a maximum gain control block for receiving the peak input voltage from the peak value detector for generating a maximum gain controlled peak value Vp; and c) applying a positive-and-negative AGC reference voltage (Vref$^+$_AGC, Vref$^-$_AGC) generation block for receiving and applying the maximum gain controlled peak value Vp to generate a positive AGC reference voltage Vref$^+$_AGC and a negative AGC reference voltage Vref$^-$_AGC.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 3:
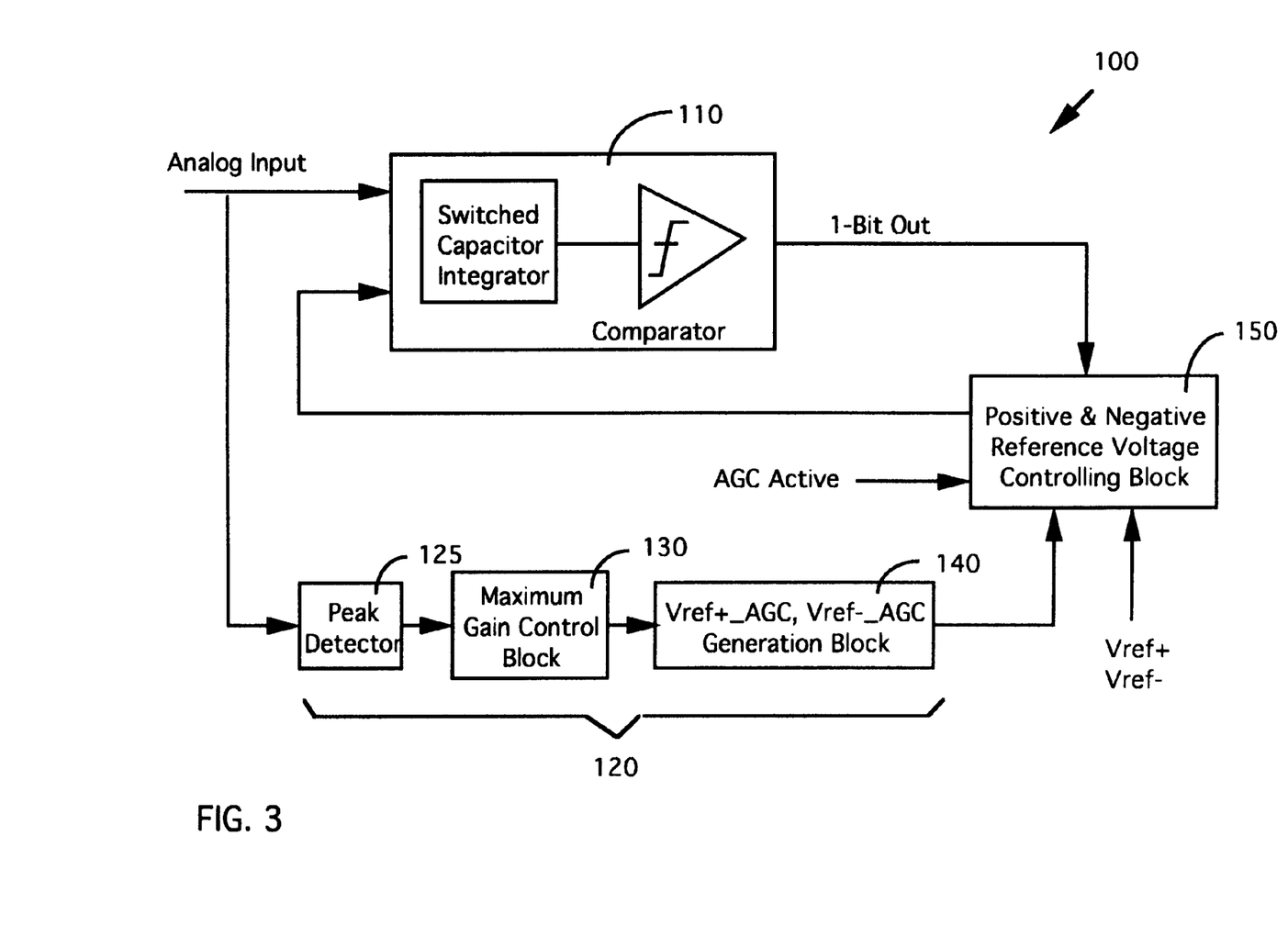
FIG. 3 is a functional block diagram showing the architecture of the fully integrated sigma-delta modulator with the AGC circuit.

Referring to FIG. 3 for a schematic circuit diagram of the present invention which shows an enhanced sigma-delta modulating device 100. The enhanced sigma-delta modulating device 100 includes circuit elements to perform the sigma-delta function fully integrated with circuits for performing AGC functions. There are three added functional blocks which are dedicated for performing the AGC functions which are integrated as part of this enhanced sigma-delta modulator device 100. Unlike the sequential processing flow of the prior art circuits as that shown in FIG. 1, the analog input signals to this enhanced sigma-delta modulator 100 are processed in parallel by a sigma-delta modulator 110 and an AGC circuit 120.

Figure 4:
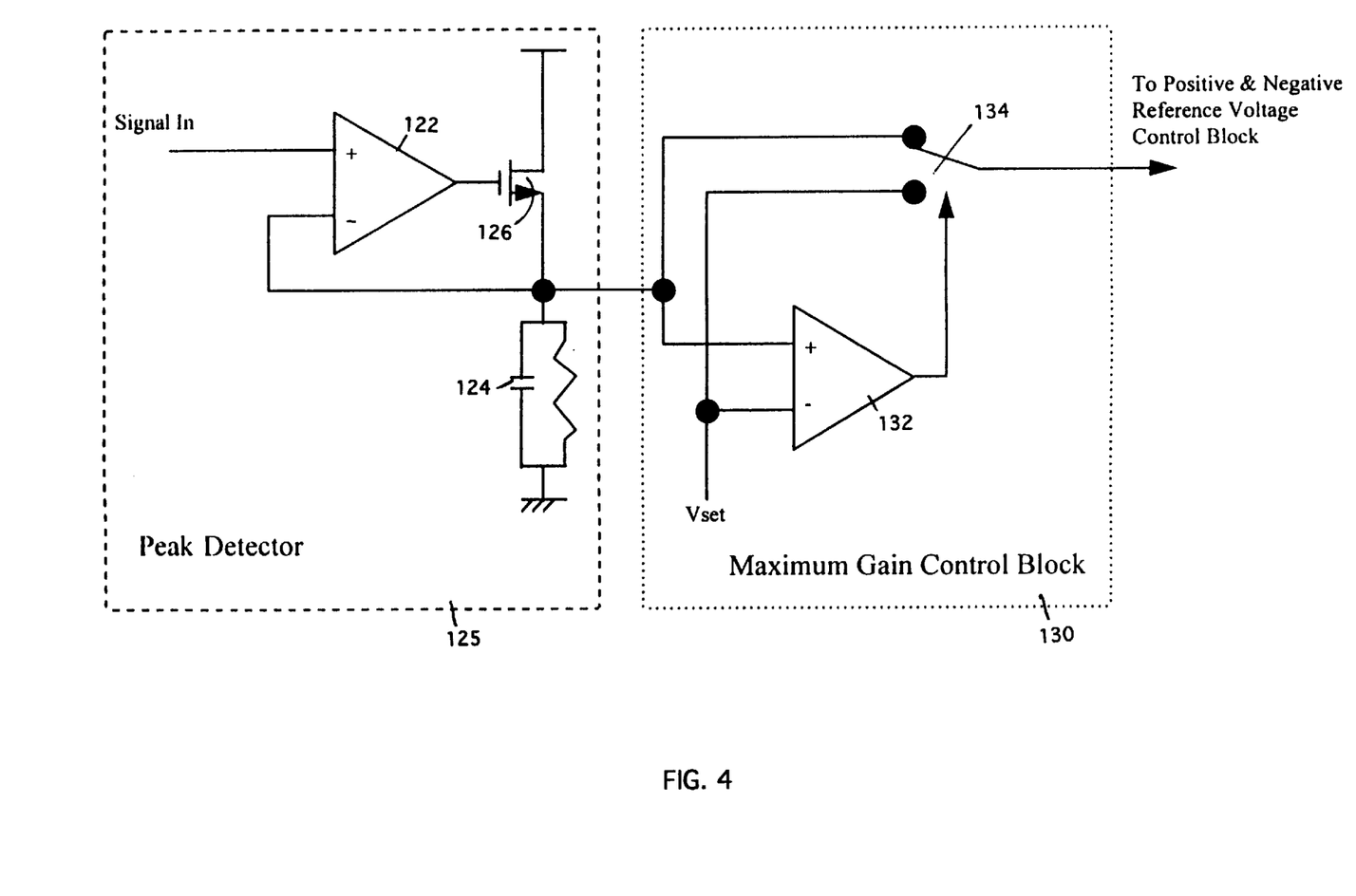
FIG. 4 is a functional block diagram of a peak detector and a maximum gain control block of the present invention.

The analogy input signal is transmitted to a peak detector 125 for a peak determination. Based on the peak value determined by the peak detector 125, a maximum gain is determined by a maximum gain control block 130. The gain is inversely proportional to the peak value determined by the peak value detector 125. A larger gain is applied when a smaller peak value is detected. Refer to FIG. 4 for a circuit implementation of the maximum gain control circuit 130. In the peak detector 125, under the control of the operation amplifier (OPAMP) 122, a peak value of an input signal is stored in the capacitor 124 through a transistor 126 which is turned on when an input signal is greater than the peak value stored in the capacitor 124. The peak value of the input signal generated by the peak detector 125 is received by the maximum gain control block 130. The value of the maximum gain is inversely proportional to the peak value determined by the peak detector 125. The smaller the peak value of the input signals generated by the peak detector 125, the greater is the magnitude of the gain produced by the maximum gain control block 130. When the magnitude of the noises is about the same as that of the signals, a large percents of the output generated by the AGC are produced from the amplification of the noises. For some types of applications, this undesirable effect must be carefully controlled. As the maximum gain of an AGC is controlled by the maximum gain control block 130, a minimum voltage is set at $V_{set}$ for the maximum gain control block 130. When the peak value of the input signal is greater than the minimum voltage $V_{se}$, the peak value is applied, otherwise, the minimum $V_{set}$. value is employed as the gain generated by the maximum gain control block 130. The functions performed by the maximum gain control block 130 is implemented with a comparator 132 and a switch 134. The comparator 132 compares the values of $V_{set}$ and the peak value of the input signal to generate an output signal to control the switch 134 to connect the positive and negative reference voltage control block to either the $V_{set}$ or the output from the peak detector 125.

Figure 5:
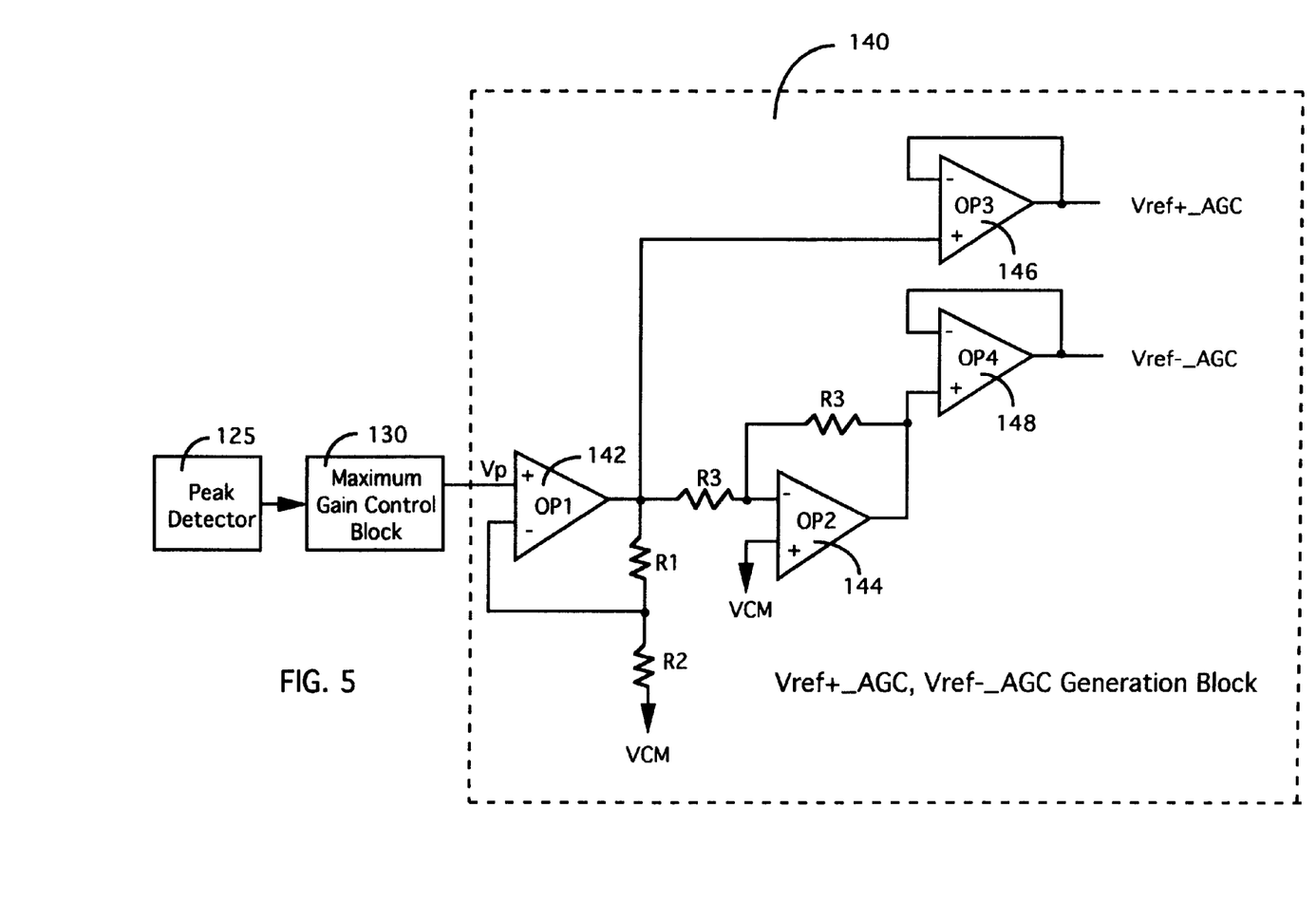
FIG. 5 is a circuit diagram of a reference voltage generator of the present invention.

Referring back to FIG. 3, the output from the maximum gain control block 130 is then provided to a Vref$^+$_AGC, Vref$^-$_AGC generation block 140 to generate a reference voltage, i.e., (Vref$^+$_AGC,Vref$^+$_AGC), for the sigma-delta modulator 110. Referring to FIG. 5 for a preferred embodiment of a circuit implementation of a Vref$^+$_AGC, Vref$^-$_AGC generation block 140. The output Vp from the maximum gain control block 130 is received into a first operation amplifier OP1 142. A common mode voltage VCM is employed in the Vref$^+$_AGC,Vref$^-$_AGC generation block 140 which has a magnitude of about $V_{DD}/2$. There are a third and a fourth operation amplifiers OP3 146 and OP4 148 which are employed as the buffer operation amplifiers for providing the charging current required by the sigma-delta modulator 110. A negative feedback loop, includes resistors R1 and R2, are provided to the first operation amplifier OP1 142 with a gain of (R1+R2)/R2. The output from the first operation amplifier OP1 is processed by a third operation amplifier OP3 to generate an output of Vref$^+$_AGC. In the meanwhile, the output from the first operation amplifier OP1 142 is also provided to a negative input terminal of a second operation amplifier OP2 144. By connecting to two identical resistors R3 as shown, the second operation amplifier functions as an unit gain inverter to generate an output for inputting to a fourth operation amplifier OP4 148 functioning as a unity gain buffer to produce an output signal of Vref$^-$_AGC. According to the circuits shown in FIG. 5, the reference voltages generated by the Vref$^+$_AGC,Vref$^-$_AGC generation blocks 140 are:

$$\text{Vref}^+\_\text{AGC} = \text{VCM} + [(R1+R2)/R2](V_P - \text{VCM}) \quad (1)$$

$$\text{Vref}^-\_\text{AGC} = \text{VCM} - [(R1+R2)/R2](V_P - \text{VCM}) \quad (2)$$

When the peak value of the input signals is smaller than $V_{SET}$ the input voltage to the Vref+_AGC,Vref−_AGC generation block 140 is $V_P = V_{SET}$. A ratio of the reference values, i.e., Vref+_AGC and Vref−_AGC, to the input peak value Vp can be calculated based on Equations (1) and (2). The reference voltage generated, i.e., Vref+_AGC and Vref−_AGC can be employed by the sigma-delta modulator 110 to produce output signals with equivalent functions as that performed with an automatic gain controller (AGC). The resistance of the resistors R1 and R2 can be flexibly adjusted such that the reference voltages Vref+_AGC and Vref−_AGC are slightly greater than the peak value Vp such that the sigma-delta modulator would not be operated under saturation and unstable conditions. By adjusting the resistance of R1 and R2, the output voltage of the AGC can be effectively controlled.

Figure 6:
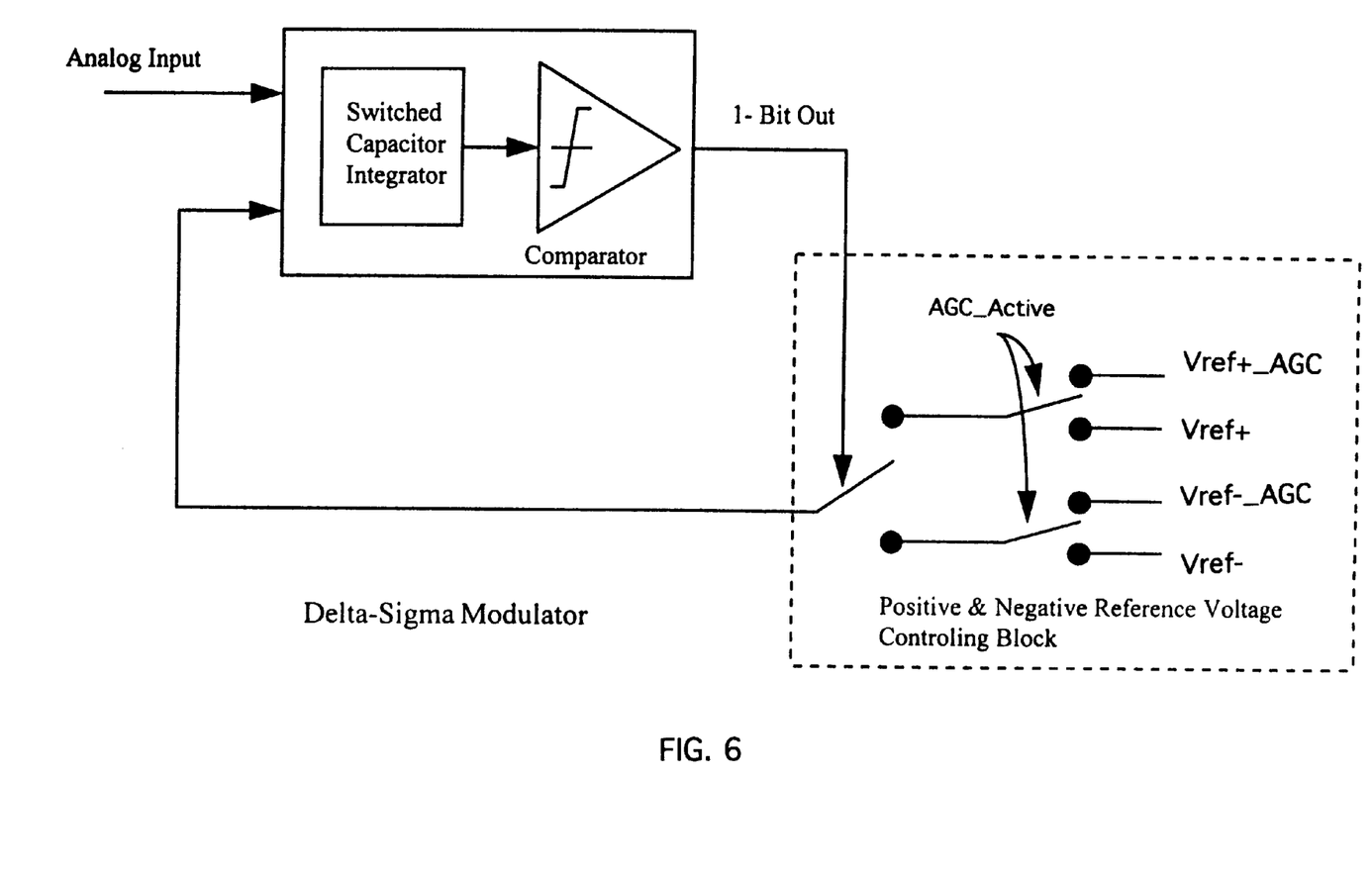
FIG. 6 is a functional block diagram of showing the control function performed by the positive and negative reference voltage controlling block of the feedback reference signal to the sigma-delta modulator.
Figure 7:
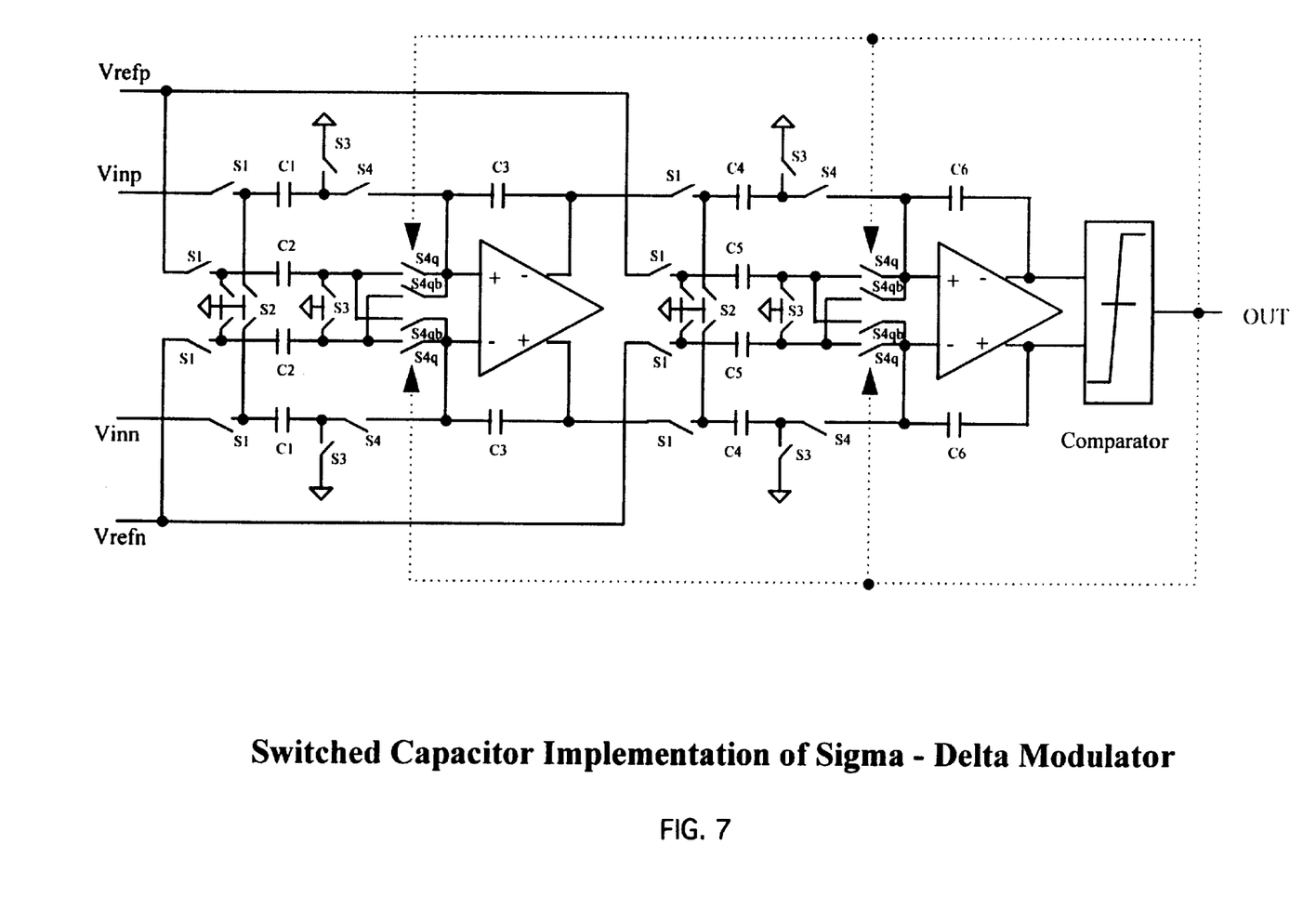
FIG. 7 is a circuit diagram of the sigma-delta modulator.
Figure 8:
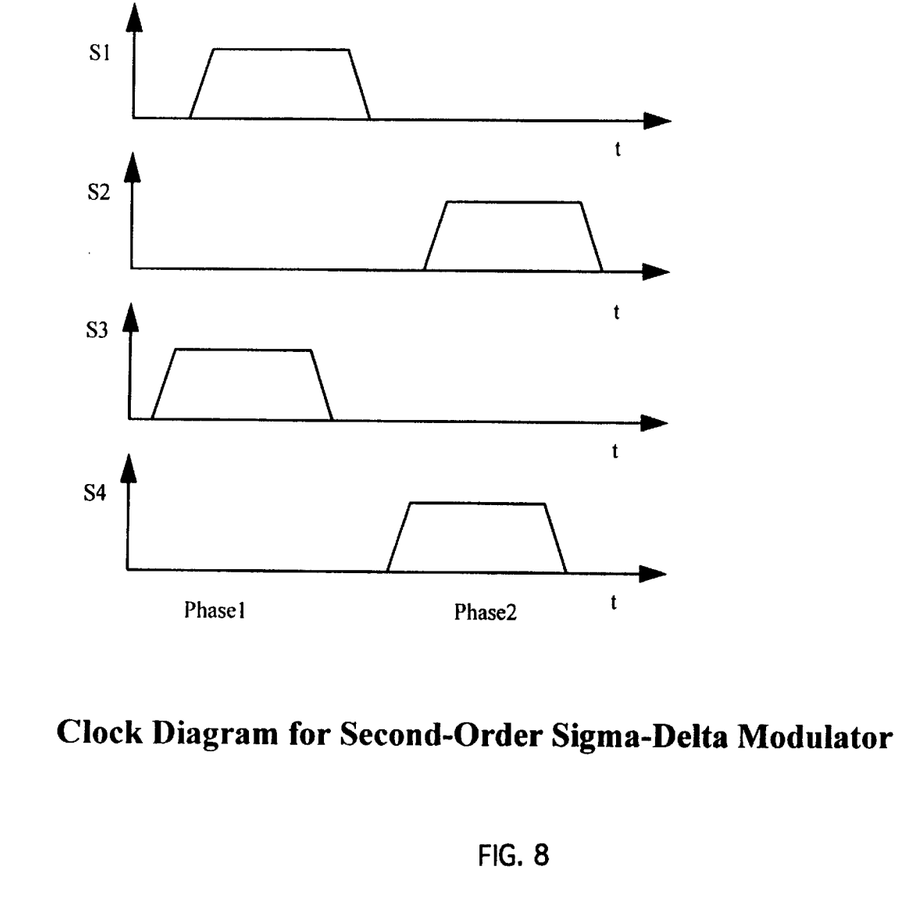
FIG. 8 is clock timing diagram for a second-order sigma-delta modulator.

Referring back to FIG. 3, the reference voltages Vref+_AGC and Vref−_AGC generated from the Vref+_AGC, Vref−_AGC generation block 140 is received by the positive and negative reference voltage controlling block 150. Another set of fixed input voltages, i.e., Vref+ and Vref− are inputted to the positive and negative reference voltage controlling block 150. A combination of the sigma-delta modulation function with the reference voltage control provided by the automatic gain control (AGC) operations described above is shown in FIG. 6. An AGC active signal is applied for controlling the generation the output signal of the final sigma-delta modulator 100. Under the condition when the AGC active signal is a ON signal, i.e., AGC function is required, then a reference voltage of Vref+_AGC and Vref−_AGC are selected. Otherwise, under the normal analog to digital conversion operations, then, the fixed reference voltages of Vref+ and Vref− are selected. The details of circuit implementation for a sigma-delta modulator 110 is shown in FIG. 7 wherein a fully differential switched-capacitor configuration is employed. FIG. 7 shows a two stage sigma-delta modulator as an example of embodiment wherein the number of stages can be flexibly adjusted for different types of implementation. Two integrators are included in the two-stage sigma-delta modulator wherein each integrator consists of an OPAMP and four sampling capacitors, i.e., two pairs of C1, C2, and two integrating capacitors, i.e., a pair of capacitor C3. The input voltages, i.e., $V_{inp}$ and $V_{inn}$, are sampled by capacitor C1 and the reference voltage, $V_{refp}$ and $V_{irefn}$, are sampled by capacitor C2. The operation of the modulator is control by a non-overlapping two phase clock. In phase 1, switch S1 and S3 are conductive and switches S2 and S4q (or S4qb) are turned off. The input signals, $V_{inp}$ and $V_{inn}$, and the reference signals, $V_{refp}$ and $V_{refn}$, are sampled by capacitor C1 and C2. Alternately, in phase 2, switch S2 and S4q (or S4qb) are conductive and switches S1 and S3 are turned off. The charges stored in capacitors C1 and C2 are transmitted to capacitor C3. The functions carried out by the second stage integrator are similar to that performed by the first stage integrator except that the input signals are received from the first stage integrator. In phase 1, the output signal from the second stage integrator is received by the comparator. The result of the comparison made by the comparator is applied to turn on either switch S4q or switch S4b. Referring to FIG. 8 for a clock diagram for the switch operations of the second-order sigma-delta modulator which utilizes this non-overlapping two phase clock In order to prevent a signal-dependent charge injection, the opening of the switches S3 and S4 are adjusted to be slightly earlier than the turning on time of switches S1 and S2.

Referring back to FIG. 6, the signals represented by $V_{efn}$ and $V_{refp}$ define the positive and negative reference voltages generated by the controlling block and the signal AGC_Active as shown in FIG. 6 represents a control signal for a multiplexer. When the signal AGC_Active has a high value, the positive and negative reference voltage controlling block generates output signals of Vref+_AGC and Vref−_AGC, i.e., Vrefp=Vref+_AGC, and Vrefn=Vref−_AGC. In a normal operation when the AGC function is turned off, the control signal AGC_Active signal has a low value and the output signals Vrefp=Vref+ and Vrefn=Vref−. Thus a regular A/D function is carried out.

According to FIGS. 3 to 8, and above descriptions, this invention discloses an automatic gain control (AGC) feedback-referenced sigma-delta modulating device provided for processing an analog signal therein. The device includes an automatic gain controller (AGC) which includes a peak detector for receiving and detecting a peak input voltage of the analog input signal. The automatic gain controller further includes a maximum gain control block for receiving the peak input voltage from the peak value detector for generating a maximum gain controlled peak value Vp. The automatic gain controller further includes a positive-and negative AGC reference voltage (Vref+_AGC, Vref−_AGC) generation block for receiving and applying the maximum gain controlled peak value Vp to generate a positive AGC reference voltage Vref+_AGC and a negative AGC reference voltage Vref−_AGC. The automatic gain control (AGC) feedback-referenced sigma-delta modulating device further includes a sigma-delta modulator which includes a switched capacitor integrator for receiving the analog input signal and an AGC feedback of the positive AGC reference voltage Vref+_AGC and the negative AGC reference voltage Vref−_AGC for processing the analog input signal and the AGC feedback of the positive AGC reference voltage Vref+_AGC and the negative AGC reference voltage Vref−_AGC for generating a one binary bit output therefrom. In a preferred embodiment, the automatic gain control (AGC) feedback-referenced sigma-delta modulating device further includes a positive and negative reference voltage controlling block for receiving an AGC active signal for controlling an application of either a set of predefined constant positive and negative reference voltages (Vref+, Vref−) or the positive AGC reference voltage Vref+_AGC and the negative AGC reference voltage Vref−_AGC as the AGC feedback to the sigma-delta modulator. In a preferred embodiment, the maximum gain control block further include a minimum peak-voltage input means for inputting a minimum peak voltage $V_{set}$ to the maximum gain control block. And, the maximum gain control block further include a comparing means for comparing the input peak voltage and the minimum peak voltage for generating the maximum gain controlled peak value Vp such that $Vp \geq V_{set}$. In another preferred embodiment, the positive-and-negative AGC reference voltage (Vref+_AGC, Vref−_AGC) generation block further includes a common mode voltage input means for inputting a common mode voltage VCM to the positive-and-negative AGC reference voltage (Vref+_AGC, Vref−_AGC) generation block And, the positive-and-negative AGC reference voltage (Vref+_AGC, Vref−_AGC) generation block further includes a reference voltage generating means for generating the positive AGC reference voltage Vref+_AGC and the negative AGC reference voltage Vref−_AGC as:

$$\text{Vref}^+\_\text{AGC}=\text{VCM}+C(V_P-\text{VCM});$$

and $$\text{Vref}^-\_\text{AGC}=\text{VCM}-C(V_P-\text{VCM})$$

where C is a predefined constant coefficient provided for the reference voltage generating means. In yet another preferred embodiment, the positive and negative reference voltage controlling block further includes a sigma-delta modulator reference voltage means for providing a set of positive and negative sigma-delta modulator reference voltage $V_{ref}^+$ and $V_{ref}^-$. And, the positive and negative reference voltage controlling block further includes a reference voltage selecting means for selecting to apply the set of the positive AGC reference voltage Vref$^+$_AGC and the negative AGC reference voltage Vref$^-$_AGC or the set of positive and negative sigma-delta modulator reference voltage $V_{ref}^+$ and $V_{ref}^-$ as the AGC feedback to the sigma-delta modulator.

In summary, an automatic gain control (AGC) feedback-referenced sigma-delta modulating device is disclosed in this invention which is provided for processing an analog signal received therein. This device includes an automatic gain controller (AGC) for receiving processing the analog input signal for generating an AGC feedback including a set of positive and negative AGC reference voltages. This device further include a sigma-delta modulator for receiving the analog input signal and the AGC feedback of the set of the positive and negative AGC reference voltages for generating a one binary bit output therefrom. In a preferred embodiment, the automatic gain controller (AGC) includes a peak detector for receiving and detecting a peak input voltage of the analog input signal. The automatic gain controller (AGC) further includes a maximum gain control block for receiving the peak input voltage from the peak value detector for generating a maximum gain controlled peak value Vp. And, the automatic gain controller (AGC) further includes a positive and-negative AGC reference voltage (Vref$^+$_AGC, Vref$^-$_AGC) generation block for receiving and applying the maximum gain controlled peak value Vp to generate a positive AGC reference voltage Vref$^+$_AGC and a negative AGC reference voltage Vref$^-$_AGC.

Based on the descriptions for above embodiments as that shown in FIGS. 3 to 8, this invention further discloses a method for generating an automatic gain control (AGC) feedback-referenced sigma-delta modulating signal from an analog input signal. The method includes the steps of a) applying a peak detector for receiving and detecting a peak input value of the analog input signal; b) applying a maximum gain control block for receiving the peak input value from the peak value detector for generating a maximum gain controlled peak value Vp; c) applying a positive-and-negative AGC reference voltage (Vref$^+$_AGC, Vref$^-$_AGC) generation block for receiving and applying the maximum gain controlled peak value Vp to generate a positive AGC reference voltage Vref$^+$_AGC and a negative AGC reference voltage Vref$^-$_AGC; and d) applying a sigma-delta modulator with a switched capacitor integrator for receiving the analog input signal and an AGC feedback of the positive AGC reference voltage Vref$^+$_AGC and the negative AGC reference voltage Vref$^-$_AGC for processing the analog input signal and the AGC feedback of the positive AGC reference voltage Vref$^+$_AGC and the negative AGC reference voltage Vref$^-$_AGC for generating a one binary bit output therefrom. In a preferred embodiment, the method further includes a step of receiving an AGC active signal for controlling a reference voltage input to the sigma-delta modulator of either a predefined constant positive and negative reference voltages (Vref+, Vref–) or the AGC feedback including the positive AGC reference voltage Vref$^+$_AGC and the negative AGC reference voltage Vref$^-$_AGC. In another preferred embodiment, the step of applying a maximum gain control block for generating a maximum gain controlled peak value Vp further include a step of applying a minimum peak-voltage input means for inputting a minimum peak voltage $V_{set}$ to the maximum gain control block; and applying a comparing means for comparing the input peak voltage and the minimum peak voltage for generating the maximum gain controlled peak value Vp such that $Vp \geq V_{set}$. In yet another preferred embodiment, the step of generating the positive-and-negative AGC reference voltage (Vref$^+$_AGC, Vref$^-$_AGC) further includes a step of employing a common mode voltage input means for inputting a common mode voltage VCM to the positive-and-negative AGC reference voltage (Vref$^+$_AGC, Vref$^-$_AGC) generation block; and applying a positive and negative reference voltage generating means for generating the positive AGC reference voltage Vref$^-$_AGC and the negative AGC reference voltage Vref$^-$_AGC as:

$$\text{Vref}^+\_\text{AGC}=\text{VCM}+C(V_P-\text{VCM});$$

and $$\text{Vref}^-\_\text{AGC}=\text{VCM}-C(V_P-\text{VCM})$$

where C is a predefined constant coefficient provided for the reference voltage generating means. In yet another preferred embodiment, the step of controlling a reference voltage input to the sigma-delta modulator further includes a step of applying a sigma-delta modulator reference voltage means for providing a set of positive and negative sigma-delta modulator reference voltage $V_{ref}^+$ and $V_{ref}^-$; and applying a reference voltage selecting means for selecting to apply the set of the positive AGC reference voltage Vref$^+$_AGC and the negative AGC reference voltage Vref$^-$_AGC or the set of positive and negative sigma-delta modulator reference voltage $V_{ref}^+$ and $V_{ref}^-$ as the AGC feedback to the sigma-delta modulator.

In summary, this invention also discloses a method for generating an automatic gain control (AGC) feedback-referenced sigma-delta modulating signal from an analog input signal. The method includes the step of a) an automatic gain controller (AGC) for receiving processing the analog input signal for generating an AGC feedback including a set of positive and negative AGC reference voltages; and b) applying a sigma-delta modulator for receiving the analog input signal and the AGC feedback of the set of the positive and negative AGC reference voltages for generating a one binary bit output therefrom. In a preferred embodiment, the step a) of applying the automatic gain controller (AGC) for generating an AGC feedback further includes a step a1) of applying a peak detector for receiving and detecting a peak input voltage of the analog input signal; a2) applying a maximum gain control block for receiving the peak input voltage from the peak value detector for generating a maximum gain controlled peak value Vp; and c) applying a positive-and-negative AGC reference voltage (Vref$^+$_AGC, Vref$^+$_AGC) generation block for receiving and applying the maximum gain controlled peak value Vp to generate a positive AGC reference voltage Vref$^+$_AGC and a negative AGC reference voltage Vref$^-$_AGC.

By combining the circuits 120 for performing the automatic gain control functions with the circuits 110 for a sigma delta modulator, the signal to noise ratio (SNR) is improved.

Compared to the SNR for a conventional IC which is about 20 to 30 dB, the improved sigma-delta modulator integrated with an AGC can achieve a SNR of about 60 dB. A better dynamic range is also achieved by the improved sigma-delta modulator combined with AGC circuit of this invention where the input transfer function provides better approximation of the ideal transfer curve than the conventional AGC circuits.

Figure 9:
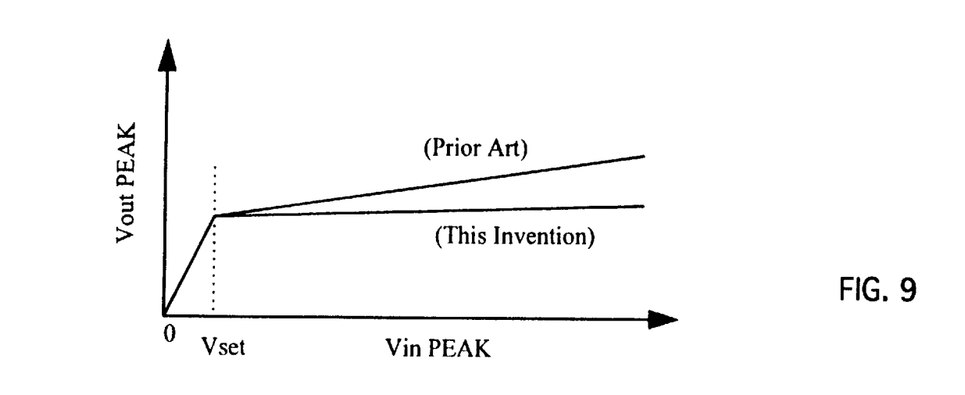
FIGS. 9 and 10 are comparisons of the output peak voltages and the signal to noise ratios as function of the input peak voltage of the prior art device and the device of the present invention.
Figure 10:
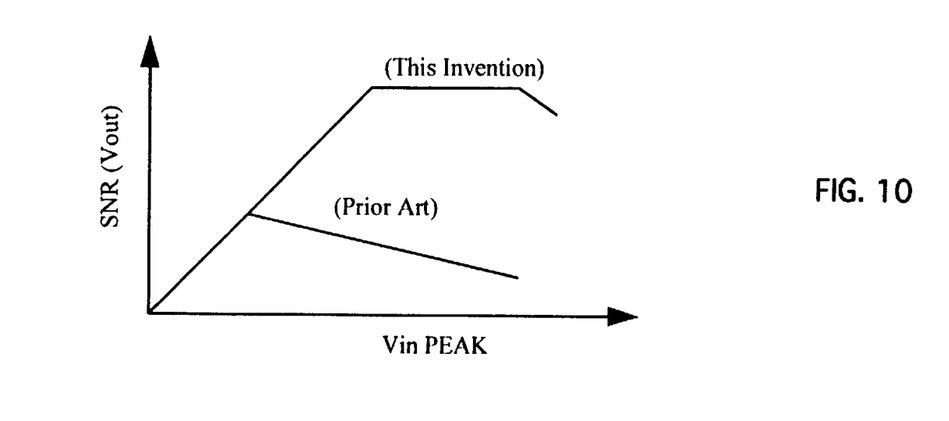

Referring to FIGS. 9 and 10 for the performance comparisons of the conventional circuit architecture with the performance achieved by the improved sigma-delta modulator integrated with the AGC 100 of the present invention. FIG. 9 shows the comparison of the variations of the output peak voltage as a function of the peak input voltage. A better constant peak output voltage is maintained by the modulator 100 of the present invention than the conventional device. FIG. 10 compares the changes of the SNR as the function of the input peak voltage Vin-peak. The performance of the prior art device is worsened with increased input peak voltage. The transfer characteristics as that implemented in a prior art configuration as that shown in FIG. 2 cannot be conveniently designed. The value of gain is controlled by the value generated by a peak detector. When the input value is increased, a higher peak value is detected by the peak detector and a smaller gain is employed. For this reason, the linearlity is worsened when the input signal is increased. In contrast, the SNR produced by the improved sigma-delta modulator 100 of the present invention is basically improved with the increase of the input peak voltage. It is obvious that better performance is achieved by the improved sigma-delta modulator disclosed by this invention. The better performance is achieved by adjusting the gain by controlling the reference signals $V_{refp}$ and $V_{refn}$. When there are changes in the input signal, the value of the reference signals $V_{refp}$ and $V_{refn}$ are also changed. The changes of the reference signals are maintained to have fixed constant proportional ratio with the input signal. The ratio is determined by the values of R1 and R2 (see FIG. 5). Under an ideal situation in a sigma-modulator when there is a constant ratio between the input signal with reference signal $V_{refp}$ and $V_{refn}$ then the signal to noise ratio (SNR) of the output signal is maintained as a constant.

Figure 11A:
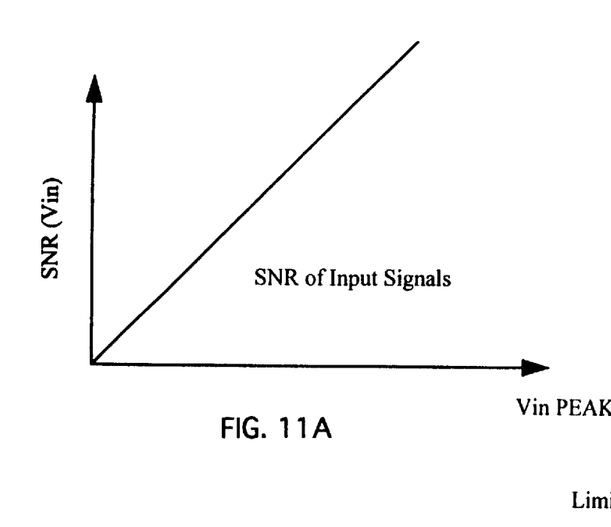
FIGS. 11A to 11C show respectively for the signal to noise ratio (SNR) of the input signal, an idea sigma-delta modulator with AGC, and a sigma-delta modulator with AGC of the present invention.
Figure 11B:
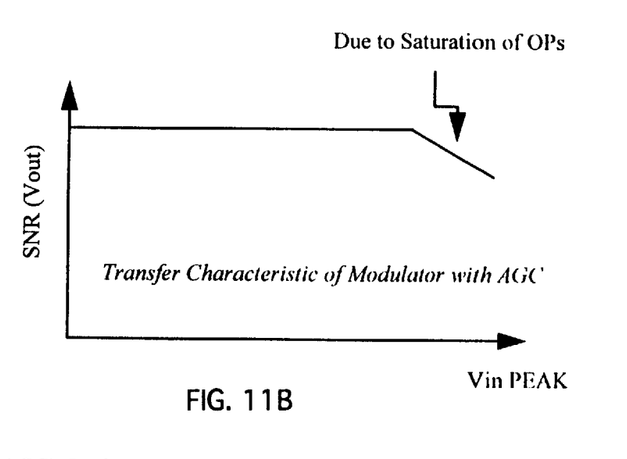
Figure 11C:
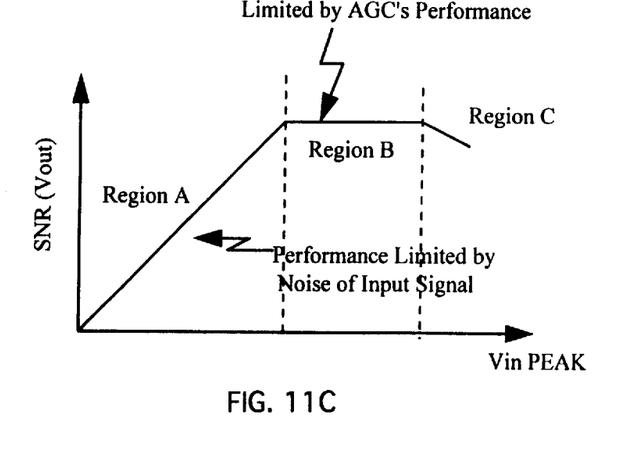

This can be understood by referring to FIGS. 11A to 11C where FIG. 11A shows that the signal to noise ratio (SNR) for the input signal is linearly proportional to the peak value of the input signal. FIG. 11B shows a SNR of an output signal for an ideal sigma-delta modulator AGC circuit When noises generated by the circuit are excluded, the SNR of the output signal remains unchanged with increased peak value of the input signal. The SNR starts to decrease when the peak value of the input signal exceed certain value due to the saturation of the circuit. It can be resolved by controlling the peak value of the input signal. FIG. 11C shows the variation of the output signal SNR as function of the peak value of the input signal Vin-Peak In region A, the SNR increases the increase of the value of Vin-peak The performance of the sigma-delta modulator-AGC is limited by the noise of the input signal. In the region B, the SNR is kept constant when the peak of the input signal is grater than the predefined minimum peak value of the modulator-AGC circuit and the performance is dictated by the transfer characteristics of the modulator-AGC circuit. In region C, the SNR begins to decrease when the peak value of the input signal exceed certain saturation limit of the operational amplifier. As shown in FIGS. 9 and 10, the sigma-delta modulator-AGC circuit of this invention provide better performance and meantime, the circuit as disclosed in this invention provides a A/D and AGC functions. For certain speech applications, an additional advantage is provided by this circuit because the AGC may affect the tone quality of the speech and the AGC function can be flexibly turned off with this circuit.

When the peak value of the input signal is smaller than the preset value, i.e., Vset, the output from the maximum gain control is fixed at Vset. The reference signal of the modulator is also fixed and would not be changed with the peak value of the input signal. Therefore, when the input signal is smaller than the preset value of Vset, it operates just like a regular sigma-delta modulator where the reference signal is set at a fixed value. As the peak value of the input signal increases and the output signal is gradually increased and exceeds the preset value of Vset, the reference signal for the modulator, i.e., the reference voltages $V_{refp}$ and $V_{refn}$ become proportional to the peak value of the input signal Vin-Peak which is determined by the resistance of the resistors R1 and R2. Because this special design feature of the sigma-delta modulator, the peak value of the output signal generated from the modulator, instead of increasing with the peak value of the input signal as that produced in a prior art modulator, is maintained at a constant level as that shown in FIG. 9. Therefore, the combined sigma-delta modulator and the AGC device as disclosed in the present invention can produce output signals with improved characteristics which have better and greater signal to noise ratio when the peak value of the input signal is increased.

Therefore, the present invention provides a novel and improved circuit configuration and architecture for more fully integrating the AGC and the sigma-delta modulator to reduce the area requirements on a semi-conductor chip and to improve the signal to noise ratio such that the difficulties and limitations encountered in the prior art can be overcome. Specifically, a novel and improved circuit design architecture and configuration of circuit implementation to perform more fully integrated AGC and sigma-delta modulation functions are provided such that the areas occupied by these circuits on a semiconductor chip can be reduced. Furthermore, the signal to noise ratios are also improved with less signal distortions generated from the improved signal processing device. Additionally, in the novel and improved circuit design architecture, better AGC performance is obtained by achieving improved of input/output transfer function.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. An automatic gain control (AGC) feedback-referenced sigma-delta modulating device provided for processing an analog signal therein comprising:

an automatic gain controller (AGC) includes a peak detector for receiving and determining a peak input voltage of said analog input signal;

said automatic gain controller further includes a maximum gain control block for receiving said peak input voltage from said peak value detector for generating a maximum gain controlled peak value Vp;

said automatic gain controller further includes a positive-and-negative AGC reference voltage ($Vref^+$_AGC, $Vref^-$_AGC) generation block for receiving and applying said maximum gain controlled peak value Vp to generate a positive AGC reference voltage Vref$^+$_AGC and a negative AGC reference voltage Vref$^-$_AGC; and a sigma-delta modulator includes a switched capacitor integrator for receiving said analog input signal and an AGC feedback of said positive AGC reference voltage Vref$^+$_AGC and said negative AGC reference voltage Vref$^-$_AGC for processing said analog input signal and said AGC feedback of said positive AGC reference voltage Vref$^+$_AGC and said negative AGC reference voltage Vref$^-$_AGC for generating a one binary bit output therefrom.

2. The automatic gain control (AGC) feedback-referenced sigma-delta modulating device of claim 1 further comprising:

a positive and negative reference voltage controlling block for receiving an AGC active signal for controlling an application of either a set of predefined constant positive and negative reference voltages (Vref+, Vref−) or said positive AGC reference voltage Vref$^+$_AGC and said negative AGC reference voltage Vref$^-$_AGC as said AGC feedback to said sigma-delta modulator.

3. The automatic gain control (AGC) feedback-referenced sigma-delta modulating device of claim 1 wherein:

said maximum gain control block further include a minimum peak-voltage input means for inputting a minimum peak voltage $V_{set}$ to said maximum gain control block; and said maximum gain control block further include a comparing means for comparing said input peak voltage and said minimum peak voltage for generating said maximum gain controlled peak value Vp such that $Vp \geq V_{set}$.

4. The automatic gain control (AGC) feedback-referenced sigma-delta modulating device of claim 1 wherein:

said positive-and-negative AGC reference voltage (Vref$^+$_AGC, Vref$^-$_AGC) generation block further includes a common mode voltage input means for inputting a common mode voltage VCM to said positive-and-negative AGC reference voltage (Vref$^+$_AGC, Vref$^-$_AGC) generation block; and said positive-and-negative AGC reference voltage (Vref$^+$_AGC, Vref$^-$_AGC) generation block further includes a reference voltage generating means for generating said positive AGC reference voltage Vref$^+$_AGC and said negative AGC reference voltage Vref$^-$_AGC as:

Vref$^+$_AGC=VCM+C(V$_P$−VCM);

and

Vref$^-$_AGC=VCM−C(V$_P$−VCM)

where C is a predefined constant coefficient provided for said reference voltage generating means.

5. The automatic gain control (AGC) feedback-referenced sigma-delta modulating device of claim 2 wherein:

said positive and negative reference voltage controlling block further includes a sigma-delta modulator reference voltage means for providing a set of positive and negative sigma-delta modulator reference voltage $V_{ref}^+$ and $V_{ref}^-$; and said positive and negative reference voltage controlling block further includes a reference voltage selecting means for selecting to apply said set of said positive AGC reference voltage Vref$^+$_AGC and said negative AGC reference voltage Vref$^-$_AGC or said set of positive and negative sigma-delta modulator reference voltage $V_{ref}^+$ and $V_{ref}^-$ as said AGC feedback to said sigma-delta modulator.

6. An automatic gain control (AGC) feedback-referenced sigma-delta modulating device provided for processing an analog signal therein comprising:

an automatic gain controller (AGC) for receiving and processing said analog input signal for generating an AGC feedback including a set of positive and negative AGC reference voltages; and a sigma-delta modulator configured as an integrated parallel processor with said AGC for simultaneously and directly receiving said analog input signal and said AGC feedback of said set of said positive and negative AGC reference voltages for generating a single-binary bit output therefrom.

7. The automatic gain control (AGC) feedback-referenced sigma-delta modulating device of claim 6 wherein:

said automatic gain controller (AGC) includes a peak detector for receiving and determining a peak input voltage of said analog input signal;

said automatic gain controller (AGC) further includes a maximum gain control block for receiving said peak input voltage from said peak value detector for generating a maximum gain controlled peak value Vp;

said automatic gain controller (AGC) further includes a positive-and-negative AGC reference voltage (Vref$^+$_AGC, Vref$^-$_AGC) generation block for receiving and applying said maximum gain controlled peak value Vp to generate a positive AGC reference voltage Vref$^+$_AGC and a negative AGC reference voltage Vref$^-$_AGC.

8. The automatic gain control (AGC) feedback-referenced sigma-delta modulating device of claim 7 further comprising:

a positive and negative reference voltage controlling block for receiving an AGC active signal for controlling an application of either a set of predefined constant positive and negative reference voltages (Vref+, Vref−) or said positive AGC reference voltage Vref$^+$_AGC and said negative AGC reference voltage Vref$^-$_AGC as said AGC feedback to said sigma-delta modulator.

9. The automatic gain control (AGC) feedback-referenced sigma-delta modulating device of claim 6 wherein:

said automatic gain controller (AGC) includes a peak voltage detector for generating a peak voltage greater or equal to a minimum peak voltage.

10. The automatic gain control (AGC) feedback-referenced sigma-delta modulating device of claim 7 wherein:

said positive-and-negative AGC reference voltage (Vref$^+$_AGC, Vref$^-$_AGC) generation block further includes a common mode voltage input means for inputting a common mode voltage VCM to said positive-and-negative AGC reference voltage (Vref$^+$_AGC, Vref$^-$_AGC) generation block; and said positive-and-negative AGC reference voltage (Vref$^+$_AGC, Vref$^-$_AGC) generation block further includes a reference voltage generating means for generating said positive AGC reference voltage Vref$^+$_AGC and said negative AGC reference voltage Vref$^-$_AGC as:

Vref$^+$_AGC=VCM+C(V$_P$−VCM);

and $$Vref^-\_AGC = VCM - C(V_P - VCM)$$

where C is a predefined constant coefficient provided for said reference voltage generating means.

11. The automatic gain control (AGC) feedback-referenced sigma-delta modulating device of claim 8 wherein:
    said positive and negative reference voltage controlling block further includes a sigma-delta modulator reference voltage means for providing a set of positive and negative sigma-delta modulator reference voltage $V_{ref}^+$ and $V_{ref}^-$; and
    said positive and negative reference voltage controlling block further includes a reference voltage selecting means for selecting to apply said set of said positive AGC reference voltage $Vref^+\_AGC$ and said negative AGC reference voltage $Vref^-\_AGC$ or said set of positive and negative sigma-delta modulator reference voltage $V_{ref}^+$ and $V_{ref}^-$ as said AGC feedback to said sigma-delta modulator.

12. A method for generating an automatic gain control (AGC) feedback-referenced sigma-delta modulating signal from an analog input signal comprising:
    applying a peak detector for receiving and determining a peak input value of said analog input signal;
    applying a maximum gain control block for receiving said peak input value from said peak value detector for generating a maximum gain controlled peak value Vp;
    applying a positive-and-negative AGC reference voltage ($Vref^+\_AGC$, $Vref^-\_AGC$) generation block for receiving and applying said maximum gain controlled peak value Vp to generate a positive AGC reference voltage $Vref^+\_AGC$ and a negative AGC reference voltage $Vref^-\_AGC$; and
    applying a sigma-delta modulator with a switched capacitor integrator for receiving said analog input signal and an AGC feedback of said positive AGC reference voltage $Vref^+\_AGC$ and said negative AGC reference voltage $Vref^-\_AGC$ for processing said analog input signal and said AGC feedback of said positive AGC reference voltage $Vref^+\_AGC$ and said negative AGC reference voltage $Vref^-\_AGC$ for generating a single-binary bit output therefrom.

13. The method of generating an automatic gain control (AGC) feedback-referenced sigma-delta modulating signal of claim 12 further comprising:
    receiving an AGC active signal for controlling a reference voltage input to said sigma-delta modulator of either a predefined constant positive and negative reference voltages (Vref+, Vref−) or said AGC feedback including said positive AGC reference voltage $Vref^+\_AGC$ and said negative AGC reference voltage $Vref^-\_AGC$.

14. The method of generating an automatic gain control (AGC) feedback-referenced sigma-delta modulating signal of claim 12 wherein:
    said step of applying a maximum gain control block for generating a maximum gain controlled peak value Vp further include a step of applying a minimum peak-voltage input means for inputting a minimum peak voltage $V_{set}$ to said maximum gain control block; and
    applying a comparing means for comparing said input peak voltage and said minimum peak voltage for generating said maximum gain controlled peak value Vp such that $Vp \bullet\bullet V_{set}$.

15. The method of generating an automatic gain control (AGC) feedback-referenced sigma-delta modulating signal of claim 12 wherein:
    said step of generating said positive-and-negative AGC reference voltage ($Vref^+\_AGC$, $Vref^-\_AGC$) further includes a step of employing a common mode voltage input means for inputting a common mode voltage VCM to said positive-and-negative AGC reference voltage ($Vref^+\_AGC$, $Vref^-\_AGC$) generation block; and
    applying a positive and negative reference voltage generating means for generating said positive AGC reference voltage $Vref^+\_AGC$ and said negative AGC reference voltage $Vref^-\_AGC$ as $$Vref^+\_AGC = VCM + C(V_P - VCM);$$

and $$Vref^-\_AGC = VCM - C(V_P - VCM)$$

where C is a predefined constant coefficient provided for said reference voltage generating means.

16. The method of generating an automatic gain control (AGC) feedback-referenced sigma-delta modulating signal of claim 13 wherein:
    said step of controlling a reference voltage input to said sigma-delta modulator further includes a step of applying a sigma-delta modulator reference voltage means for providing a set of positive and negative sigma-delta modulator reference voltage $V_{ref}^+$ and $V_{ref}^-$; and
    applying a reference voltage selecting means for selecting to apply said set of said positive AGC reference voltage $Vref^+\_AGC$ and said negative AGC reference voltage $Vref^-\_AGC$ or said set of positive and negative sigma-delta modulator reference voltage $V_{ref}^+$ and $V_{ref}^-$ as said AGC feedback to said sigma-delta modulator.

17. A method for generating an automatic gain control (AGC) feedback-referenced sigma-delta modulating signal from an analog input signal comprising:
    applying an automatic gain controller (AGC) for receiving processing said analog input signal for generating an AGC feedback including a set of positive and negative AGC reference voltages; and
    applying a sigma-delta modulator configured as an integrated parallel processor with said AGC for simultaneously and directly receiving said analog input signal and said AGC feedback of said set of said positive and negative AGC reference voltages for generating a single-binary bit output therefrom.

18. The method of generating an automatic gain control (AGC) feedback-referenced sigma-delta modulating signal of claim 17 wherein:
    said step of applying said automatic gain controller (AGC) for generating an AGC feedback further includes a step of applying a peak detector for receiving and determining a peak input voltage of said analog input signal;
    applying a maximum gain control block for receiving said peak input voltage from said peak value detector for generating a maximum gain controlled peak value Vp;
    applying a positive-and-negative AGC reference voltage ($Vref^+\_AGC$, $Vref^-\_AGC$) generation block for receiving and applying said maximum gain controlled peak value Vp to generate a positive AGC reference voltage $V_{ref}^+\_AGC$ and a negative AGC reference voltage $Vref^-\_AGC$.

19. The method of generating an automatic gain control (AGC) feedback-referenced sigma-delta modulating signal of claim 18 further comprising a step of:

applying a positive and negative reference voltage controlling block for receiving an AGC active signal for controlling an application of either a set of predefined constant positive and negative reference voltages (Vref+, Vref−) or said positive AGC reference voltage $Vref^+\_AGC$ and said negative AGC reference voltage $Vref^-\_AGC$ as said AGC feedback to said sigma-delta modulator.

20. The method of generating an automatic gain control (AGC) feedback-referenced sigma-delta modulating signal of claim 18 wherein:

said step of applying an automatic gain controller (AGC) for receiving processing said analog input signal for generating an AGC feedback includes a step of applying a peak voltage detector for generating a peak voltage greater or equal to a minimum peak voltage.

21. The method of generating an automatic gain control (AGC) feedback-referenced sigma-delta modulating signal of claim 19 wherein:

said step of generating said positive-and-negative AGC reference voltage ($Vref+\_AGC$, $Vref^-\_AGC$) further includes a step of applying a common mode voltage input means for inputting a common mode voltage VCM to said positive-and-negative AGC reference voltage ($Vref^+\_AGC$, $Vref^-\_AGC$) generation block; and applying a reference voltage generating means for generating said positive AGC reference voltage $Vref^+\_AGC$ and said negative AGC reference voltage $Vref^-\_AGC$ as:

$$Vref^+\_AGC=VCM+C(V_P-VCM);$$

and $$Vref^-\_AGC=VCM-C(V_P-VCM)$$

where C is a predefined constant coefficient provided for said reference voltage generating means.

22. The method of generating an automatic gain control (AGC) feedback-referenced sigma-delta modulating signal of claim 20 wherein:

said step of applying a positive and negative reference voltage controlling block further includes a step of applying a sigma-delta modulator reference voltage means for providing a set of positive and negative sigma-delta modulator reference voltage $V_{ref}^+$ and $V_{ref}^-$; and applying a reference voltage selecting means for selecting to apply said set of said positive AGC reference voltage $Vref^+\_AGC$ and said negative AGC reference voltage $Vref^-\_AGC$ or said set of positive and negative sigma-delta modulator reference voltage $V_{ref}^+$ and $V_{ref}^-$ as said AGC feedback to said sigma-delta modulator.

* * * * *